US008754512B1

(12) United States Patent (10) Patent No.: US 8,754,512 B1
Taylor et al. (45) Date of Patent: Jun. 17, 2014

(54) ATOMIC LEVEL BONDING FOR ELECTRONICS PACKAGING

(71) Applicant: Delphi Technologies, Inc., Troy, MI (US)

(72) Inventors: Ralph S. Taylor, Noblesville, IN (US); Steven E. Staller, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 13/705,269

(22) Filed: Dec. 5, 2012

(51) Int. Cl.
*H01L 23/495* (2006.01)
(52) U.S. Cl.
USPC ........... 257/675; 257/666; 257/672; 257/676; 257/E23.031
(58) Field of Classification Search
USPC ...................... 257/666–677, E23.031–23.059
See application file for complete search history.

(56) References Cited

U.S. PATENT DOCUMENTS

2005/0121771 A1* 6/2005 Lin et al. ...................... 257/700
2011/0108854 A1* 5/2011 Sung ............................... 257/77

* cited by examiner

*Primary Examiner* — Mamadou Diallo
(74) *Attorney, Agent, or Firm* — Lawrence D. Hazelton

(57) ABSTRACT

An electronic device assembly that includes a die and a substrate, and optionally a lead frame and a heat spreader. The die is characterized as an electronic device in die form, and has a polished die region. The substrate has a polished substrate region in direct contact with the polished die region. The polished die region and the polished substrate region have surface finishes effective to attach the die to the substrate by way of an atomic bond. The lead-frame has a polished lead-frame region, and the heat spreader has a polished heat spreader region. These polished regions may also be attached to the polished die region or the polished substrate region by way of an atomic bond.

12 Claims, 4 Drawing Sheets

ATOMIC LEVEL BONDING FOR ELECTRONICS PACKAGING

TECHNICAL FIELD OF INVENTION

This disclosure generally relates to a way to package high power electronics, and more particularly relates to a use atomic level bonding to attach and thereby electrically connect a substrate to an electronic device.

BACKGROUND OF INVENTION

It may be suitable to operate silicon-based semiconductor electronic devices such as power transistors or high-power integrated circuits at a junction temperatures greater 200° C. Recent developments in wide-band-gap semiconductor technologies like silicon carbide (SiC) or gallium-nitride (GaN) suggest maximum junction temperatures approaching 600° C. However, temperature limitations of typical packaging materials such as solder and thermal grease used for making thermal, electrical, and/or mechanical connections with the semiconductor dies, or their package, can lead to reduced maximum device junction temperature ratings of 125° C. to 175° C. if long-term reliability is desired. Furthermore, unevenness and inconsistency of various layers of interconnecting materials may cause inconsistent part-to-part heat dissipation characteristics, thereby requiring a further safety margin for the maximum junction temperature. For example, when a solder joint between a die and a substrate is not planer because the die and substrate are tilted with respect to each other, the thermal conductivity at one side of the die may be substantially different compared to the other side of the die. The camber of the substrate material in conjunction with the flatness of the heat spreader mating surface may cause a variability in the thickness of the thermal interface material between the substrate and the heat spreader when multiple packaged power devices are place on the heat spreader. This variability in thickness may have a large effect on the thermal performance of the power electronics system creating a difference in thermal resistance between multiple devices on the same heat spreader. Controlling that variability is the challenge. For two sided die packages or multiple die, this variability may cause differences in thermal resistance or unequal cooling of the top and bottom sides of the semiconductor die, and/or variation in the operation of the multiple die. As such, die/lead/substrate attachment techniques and packaging materials are needed to accommodate higher junction temperatures.

SUMMARY OF THE INVENTION

In accordance with one embodiment, an electronic device assembly is provided. The electronic device assembly includes a die and a substrate. The die is characterized as an electronic device in die form. The die has a polished die region. The substrate has a polished substrate region in direct contact with the polished die region. The polished die region and the polished substrate region have surface finishes effective to attach the die to the substrate by way of an atomic bond.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
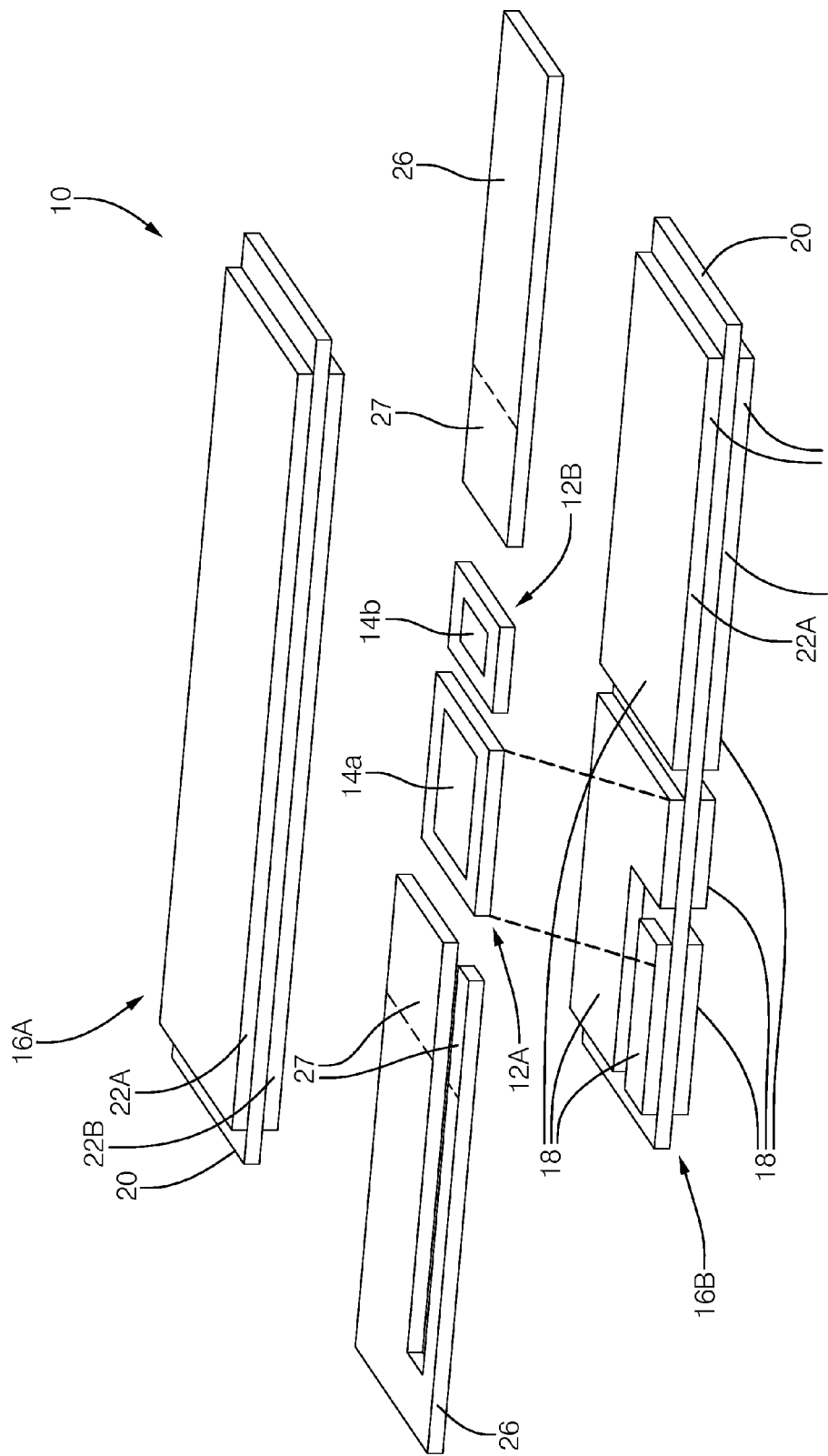
FIG. 1 is an exploded perspective view an electronic device assembly in accordance with one embodiment.

FIG. 1 illustrates an exploded view of a non-limiting example of an electronic device assembly, hereafter the assembly 10. In general, the assembly 10 includes one or more die 12, for example an insulated gate bipolar transistor (IGBT) 12A and/or a diode 12B. The die 12 are formed of essentially semi-conductor material such as silicon, germanium, silicon carbide, or gallium-nitride. As used herein, the die 12 being in die form means that the die is essentially what is provided after a wafer is singulated. The die 12 may include a layer of metal on the surface of the die used to interconnect various features on the die, and provide contact locations for interconnecting the die 12 to some other device or circuit.

Some of, or the entire layer of metal on the surface of the die 12 may be polished, planarized, or otherwise processed to form one or more polished die regions 14a, 14b suitable for forming an atomic level bond with some other feature of the assembly 10, as will be described in more detail below. It should be recognized that the opposite sides of the die 12 opposite polished die regions 14a, 14b may also be polished, planarized, or otherwise processed in a manner suitable for forming atomic level bonds. By way of example and not limitation, polishing and/or planarization of the die 12 to form the polished die region 14 may be by way of chemical mechanical polishing (CMP) or other known polishing methods. CMP is commonly used during semiconductor fabrication to polish and/or planarize the surfaces of dies to less than on angstrom (1 Å). CMP is also used in the manufacture of disk drives for the planarization of a disk surface coated with an aluminum alloy.

Figure 2:
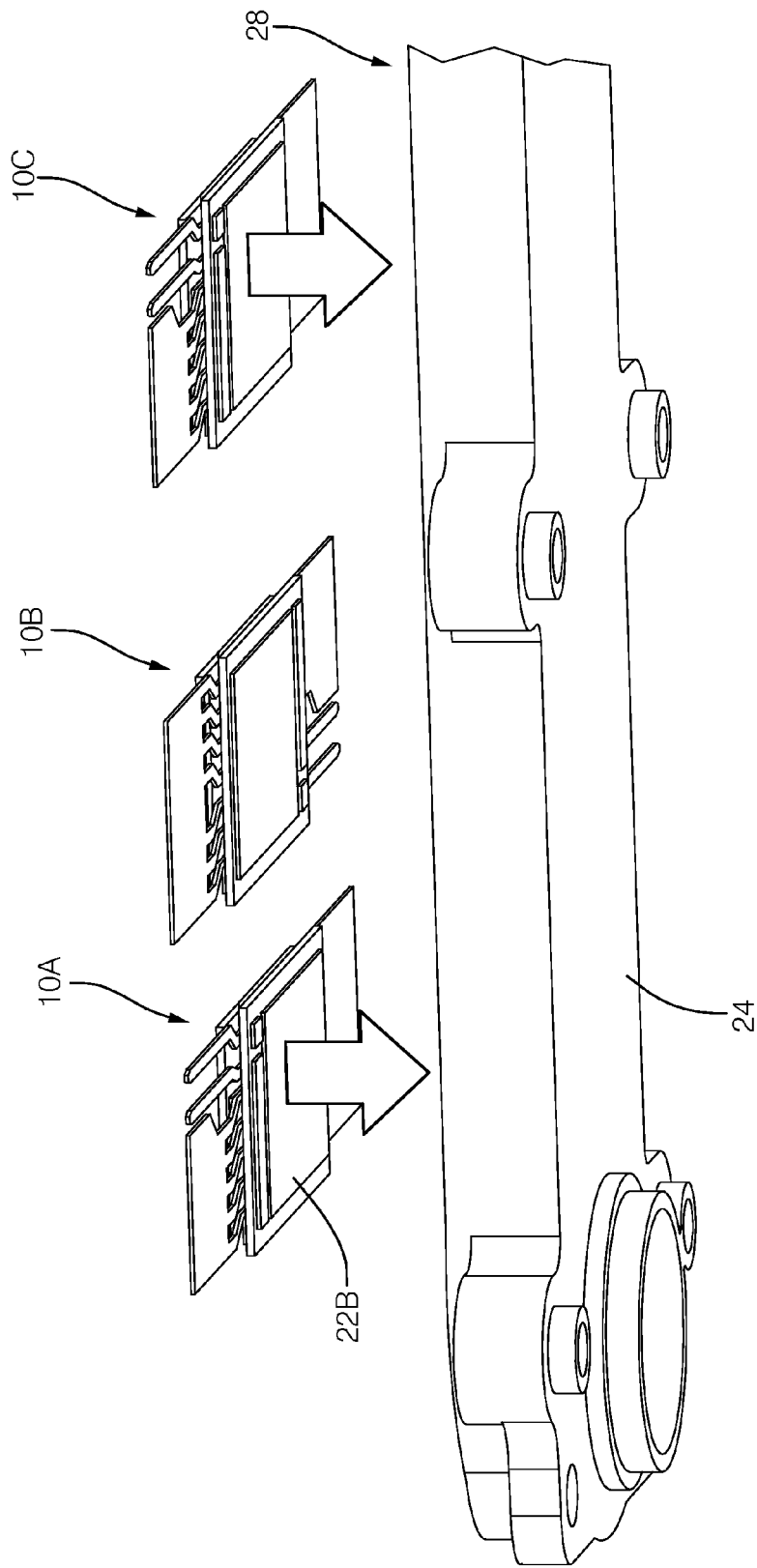
FIG. 2 is a perspective view of the assembly of FIG. 1 prior to attachment to a heat spreader in accordance with one embodiment.
Figure 3:
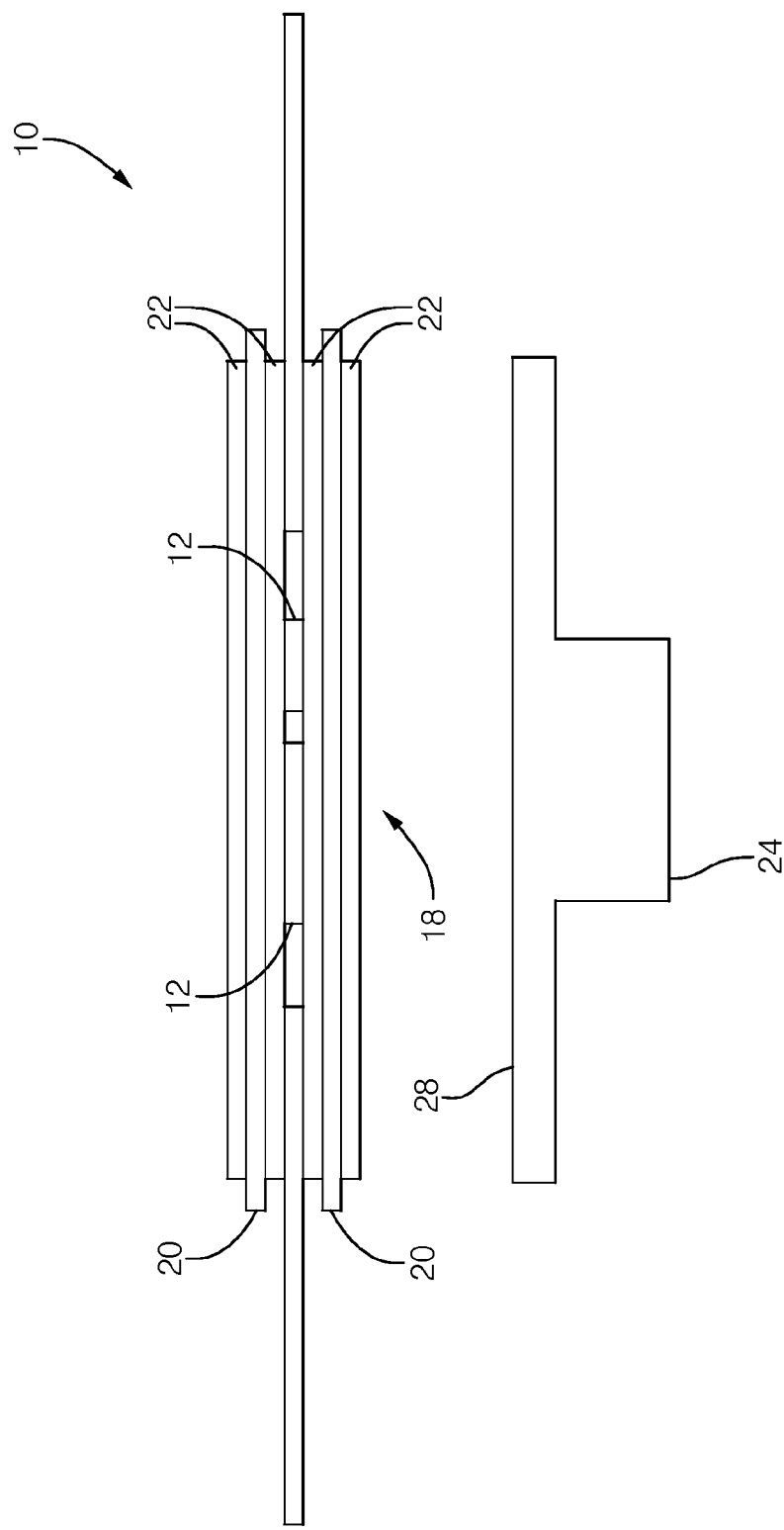
FIG. 3 is a side view of the perspective view of FIG. 2 in accordance with one embodiment.
Figure 4:
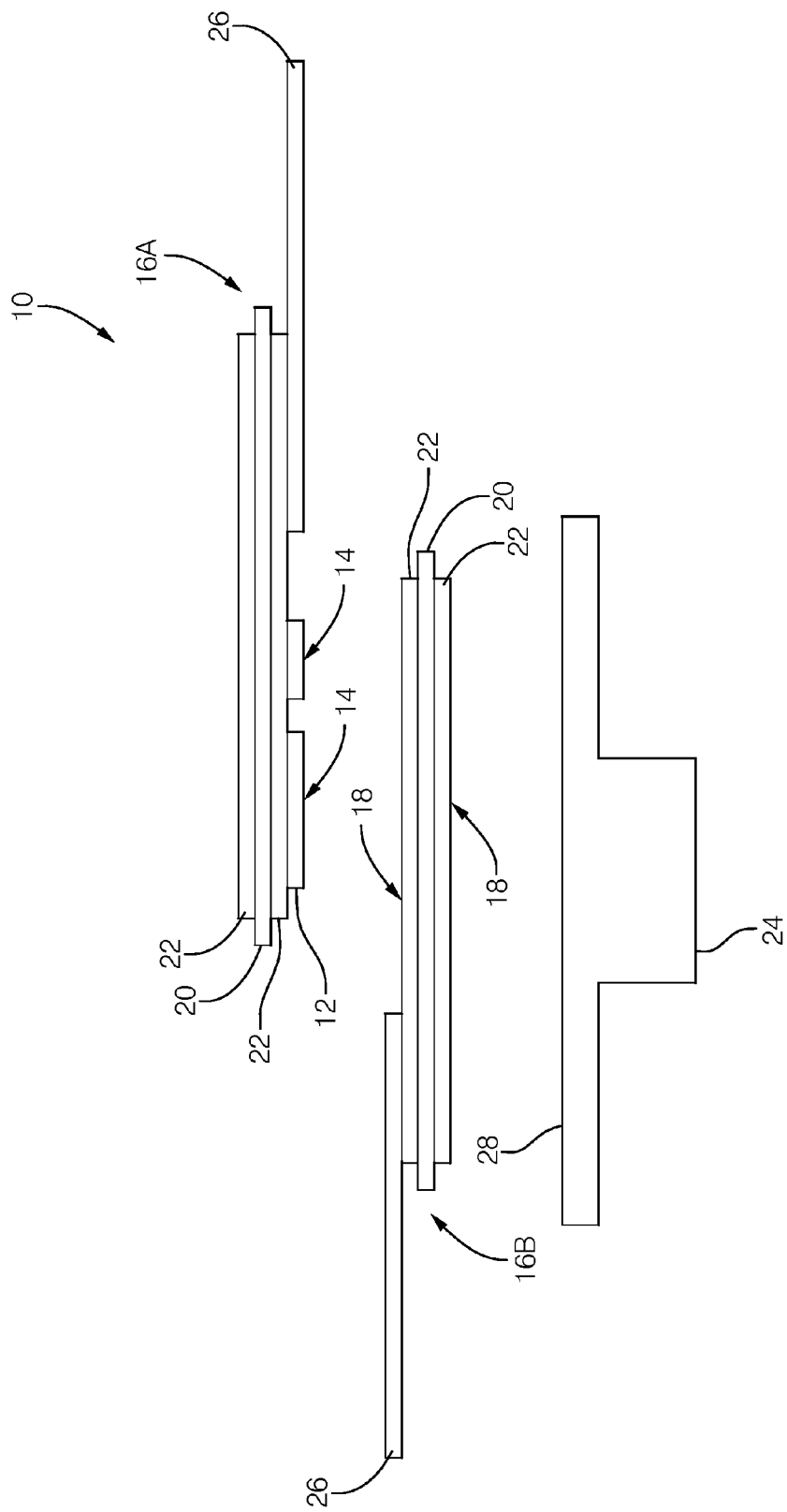
FIG. 4 is a side view an alternative embodiment of the assembly of FIG. 1 in accordance with one embodiment.

The assembly 10 may include a substrate 16, for example an upper substrate 16A and a lower substrate 16B. In general, the substrate 16 includes a metalized surface formed of a material suitable for polishing to provide a polished substrate region 18 suitable for forming an atomic level bond with the polished die region 14. It should be understood that both sides of the die 12, and the sides of both the upper substrate 16A and the lower substrate 16B that are facing the die 12 have prepared surface corresponding to the polished die regions 14 and polished substrate regions 18. The assembly 10 may also include a lead frame 26 to provide an interconnect means between the substrate 16 and whatever the assembly 10 is connected to. The lead frame 26 may also have the surfaces to be in contact with the die or the substrate suitably polished or otherwise prepared to form atomic level bonds between the lead frame 26 and whatever the lead frame 26 is attached to. As such, the assembly 10 can be formed, if desired, entirely by way of atomic level bonds. It should be appreciated that the polished substrate region 18 is in direct contact with the polished die region 14, the polished lead frame region 27. Also, the polished die region 14, the polished lead frame region 27, and the polished substrate region 18 have surface finishes effective to attach the die 12 and lead frame 26 to the substrate 16 by way of an atomic bond. The assembly 10 may also include one or more heat spreaders 24 (FIGS. 2-4). The heat spreader 24 may have a polished heat spreader region 28.

The polished heat spreader region 28 is in direct contact with the polished substrate regions 18. The polished heat spreader region 28 and the planarized and polished substrate region 18 have surface finishes effective to attach the heat spreader 24 to the substrate 16 by way of an atomic bond.

In one embodiment, the opposing surfaces of the die 12 and the substrate 16 are preferably formed of aluminum, and so it follows that the polished die region 14 and the polished substrate region 18 are formed of aluminum. Alternatively, the polished die region 14 and the polished substrate region 18 may both be formed of gold or copper. While not subscribing to any particular theory, it is believed that smoother polished regions provide for stronger bonds, and lower average surface roughness Ra allows for lower temperature formation of atomic bonds such that the bonds can be formed without exceeding the processing temperature limitations of the semiconductor device. The time, temperature, and pressure profile for forming atomic level bonds is selected so the processing does not damage the semiconductor device by exceeding the processing temperature limitations of the semiconductor die. This profile varies based on the semiconductor materials. For example, a silicon die with an aluminum metallization may have a limiting temperature of 450° C. for 30 min at some pressure. Eliminating the aluminum and choosing a metal with a higher eutectic temperature could raise the temperature and possibly shorten the time using the same temperature. By way of example and not limitation, the polished die region 14, the polished lead frame region 27, the polished heat spreader region 28, and the polished substrate region 18 preferable have a roughness (Ra) of less than five nanometers (5 nm).

In general, atomic level bonds are formed by pressing together surfaces that are sufficiently polished surfaces for a sufficient period of time, with sufficient pressure, and at a sufficiently elevated temperature. While not subscribing to any particular theory, it is believed that attractive force between the electron of one atom and a proton of an adjacent atom help to form an atomic bond. The polishing process and the atomic bonding may preferably be performed in an oxygen free environment. Depending on the metals, the polished materials, die substrates, heat spreaders and lead frames, all the parts may remain in that environment until the atomic level bond has formed. It has been observed that if the polished regions have lower average surface roughness, Ra, they allow for lower temperature formation of atomic bonds such that the bonds can be formed without exceeding the processing temperature limitations of the semiconductor device. It is desirable to keep the bonding temperature lower than a temperature that could cause damage to the die 12. By way of example and not limitation, an atomic level bond between aluminum surfaces may be formed by exposing the die 12 and the substrate 16 to a temperature sufficient for an atomic bond to form, where the temperature selected is based on the materials forming the layers being bonded, and while the polished die region 14 and the polished substrate region 18 are held in contact in a manner effective to generate a pressure sufficient to form the atomic bond. The temperatures, times, and pressures may be optimized through empirical testing and microscopic examination of the atomic bonds.

It may be desirable to provide multiple electrically isolated contacts to the die 12, and so the substrate 16 may include a ceramic layer 20 formed of ceramic material such as aluminum oxide. With the ceramic layer 20 for structural support, a metallic layer 22 formed of metallic material used to provide the polished substrate region 18 overlays at least part of the ceramic layer 20. It is recognized that the metallic layer 22 may have a different thermal expansion characteristics than the ceramic layer 20, and so warping of the substrate 16 may occur if temperature is varied. As such, it may be preferable if the substrate includes a first metallic layer 22A on a first side of the ceramic layer 20, and a second metallic layer 22B on a second side of the ceramic layer 20 opposite the first side. Furthermore, if the second metallic layer 22B includes a pattern necessary to, for example, provide an electrically isolated gate connection to the IGBT 12A, then the risk of warping may be further reduced by having the pattern on the first metallic layer 22A correspond to the second metallic layer 22B, at least as much as possible in order to reduce or prevent temperature warping of the substrate 16. Substrates having a ceramic core and aluminum or copper on both sides are commercially available and sometimes referred to as direct-bond-aluminum (DBA) or direct-bond-copper (DBC) substrates.

FIG. 2 illustrates a non-limiting example of a plurality of assemblies 10A, 10B, 10C prior to being attached to a heat spreader. In the example above, the substrate 16A, the second metallic layer 22B, the substrate 16B, and the first metallic layer 22A were polished to create polished substrate regions 18 suitable to form an atomic bond with the die 12, the substrate 16B, the second metallic layer 22B, and a corresponding area of the heat spreader 24, 28 is the polished heat spreader region, are also polished effective for the assembly 10A to be atomic level bonded to the heat spreader 24. As such, the assembly 10 may includes a heat spreader thermally coupled to the substrate opposite the die. While not specifically shown, it is anticipated that the assembly 10 may include a second heat spreader attached to the opposite sides of the assemblies 10A, 10B, 10C. The heat spreader 24 may be formed of aluminum, copper clad molybdenum, or other material suitable to couple the assemblies 10A, 10B, 10C to the heat spreader 24 by way of an atomic bond.

FIG. 3 illustrates the assembly 10 show in FIG. 1 after it is assembled, but prior to being bonded to the heat spreader 24. In traditional packaging, where dies are soldered or sintered to a substrate and a thermal interface material is placed between the substrate and the heat spreader, the camber of the substrate material (the combination of the ceramic layer 20 and the metallic layer 22) in conjunction with the flatness of the heat spreader 24 mating surface may cause a variability in the thickness of the thermal interface material between the substrate and the heat spreader 24 when multiple packaged power devices are place on the heat spreader 24. This variability may have a large effect on the thermal performance of the power electronics system creating a difference in thermal resistance between multiple devices on the same heat spreader. This variability in thermal resistance shows up as a variable junction temperature between multiple devices on the same heat spreader 24 under the same operating conditions. This variability in thermal resistance is eliminated with atomic level bonding. FIG. 3 solves this problem.

FIG. 4 illustrates another non-limiting example where the assembly 10 is prepared to be atomically bonded to the heat spreader 24 by preparing a polished heat spreader region 28 suitable for atomic bonding, and one side of the die 12 are atomically bonded to the lower substrate 16B to illustrate the potential for a single sided cooled power package. It may be suitable to operate silicon-based semiconductor electronic devices such as power transistors or high-power integrated circuits at junction temperatures of greater than 200° C. Recent developments in wide-band-gap semiconductor technologies like silicon carbide (SiC) or gallium-nitride (GaN) suggest maximum junction temperatures approaching 600° C. However, temperature limitations of typical packaging materials such as solder for semiconductor die attach and thermal grease used for making thermal and/or mechanical connections with the assembly 10 can lead to reduced maximum device junction temperature ratings. In general, atomic level bonding eliminates the need for conventional die attach and thermal interface materials Recent developments in wide-band-gap semiconductor technologies like silicon carbide (SiC) or gallium-nitride (GaN) suggest maximum junction temperatures approaching 600° C. However, temperature limitations of typical packaging materials such as solder and thermal grease used for making thermal, electrical, and/or mechanical connections with the dies of these devices can lead to reduced maximum device junction temperature ratings. In general, atomic level bonding solves these problems.

Accordingly, an electronic device assembly 10 is provided. Using direct bond aluminum (DBA) as the substrate 16 to form atomic bonds with the die 12 and the heat spreader 24 is an advantageous alternative to less thermally efficient arrangements of solders and thermal interface materials such as thermal grease. Furthermore as two-sided cooling is available if a second heat spreader (not shown) is attached to the assembly 10 opposite the heat spreader 24, it avoids the limited thermal performance of commonly available semiconductor packages. Thermal modeling suggests that a thermal resistance less than 0.02° C. cm^2/W between the assembly 10 and the heat spreader 24 is possible. While the examples show that devices in die form are atomic bonded, it is contemplated that atomic bonding could also be used to attach a power module or discrete power packages.

While this invention has been described in terms of the preferred embodiments thereof, it is not intended to be so limited, but rather only to the extent set forth in the claims that follow.

We claim:

1. An electronic device assembly comprising:
    a die characterized as an electronic device in die form, said die having a polished die region;
    a substrate having a polished substrate region in direct contact with the polished die region, wherein the polished die region and the polished substrate region have surface finishes effective to attach the die to the substrate by way of an atomic bond;
    a lead frame having a polished lead-frame region in direct contact with the polished substrates region, wherein the polished lead-frame region and the polished substrate region have surface finishes effective to attach the die to the substrate by way of an atomic bond; and
    a heat spreader having a polished heat spreader region in direct contact with the polished substrate region, wherein the polished heat spreader region and the polished substrate region have surface finishes effective to attach the heat spreader to the substrate by way of an atomic bond.

2. The assembly in accordance with claim 1, wherein the polished die region and the polished substrate region are formed of any one or more of aluminum, nickel, copper plated with nickel, gold, and platinum.

3. The assembly in accordance with claim 1, wherein the polished die region and the polished substrate region have an average surface roughness (Ra) such that the temperature, time, pressure profile of a bonding process used for form the atomic bond does not damage the semiconductor device.

4. The assembly in accordance with claim 1, wherein the substrate includes a ceramic layer formed of ceramic material, and a metallic layer formed of metallic material overlaying at least part of the ceramic layer.

5. The assembly in accordance with claim 4, wherein the substrate includes a first metallic layer on a first side of the ceramic layer, and a second metallic layer on a second side of the ceramic layer opposite the first side.

6. The assembly in accordance with claim 5, wherein the first metallic layer and the second metallic layer are configured to prevent temperature warping of the substrate.

7. The assembly in accordance with claim 1, wherein the assembly includes a heat spreader thermally coupled to the substrate opposite the die.

8. The assembly in accordance with claim 7, wherein the heat spreader is formed of aluminum, and is coupled to the heat spreader by way of an atomic bond.

9. The electronic device assembly in accordance with claim 1, wherein the polished die region is also planarized.

10. The electronic device assembly in accordance with claim 1, wherein the polished lead frame region is also planarized.

11. The electronic device assembly in accordance with claim 1, wherein the polished substrate region is also planarized.

12. The electronic device assembly in accordance with claim 1, wherein the polished heat spreader region is also planarized.

* * * * *